United States Patent [19]

Toyama et al.

[11] Patent Number: 4,949,305

[45] Date of Patent: Aug. 14, 1990

[54] ERASABLE READ-ONLY SEMICONDUCTOR MEMORY DEVICE

[75] Inventors: Tsuyoshi Toyama; Kenji Kohda; Nobuaki Andoh; Kenji Noguchi; Shinichi Kobayashi, all of Hyogo, Japan

[73] Assignee: Mitsubishi Denki Kabushiki Kaisha, Tokyo, Japan

[21] Appl. No.: 254,232

[22] Filed: Oct. 6, 1988

[30] Foreign Application Priority Data

Oct. 21, 1987 [JP] Japan .................. 62-267184

[51] Int. Cl.$^5$ ............................. G11C 7/00
[52] U.S. Cl. ................... 365/185; 365/184; 357/23.5
[58] Field of Search .............. 365/182, 184, 185; 357/23.5

[56] References Cited

U.S. PATENT DOCUMENTS 4,425,632  1/1984  Iwahashi et al. .......... 365/185 X
4,453,234  6/1984  Uchida .................... 365/185

FOREIGN PATENT DOCUMENTS

0182198 A2  5/1986  European Pat. Off. .

OTHER PUBLICATIONS

Saigo et al., "A 20K-Gate CMOS Gate Array", *IEEE Journal of Solid-State Circuits*, vol. SC-18, No. 5, (Oct. 1983), pp. 578–584.

M. Van Buskirk et al., "E-PROMS Graduate to 256-K Density with Scaled n-Channel Process", *Electronics*, Feb. 24, 1983, pp. 4-112-4-117.

*Primary Examiner*—Joseph A. Popek
*Attorney, Agent, or Firm*—Lower, Price, LeBlanc, Becker & Shur

[57] ABSTRACT

Memory transistors are arranged in a plurality of rows and a plurality of columns. A source line is formed for every two bit lines formed in the column direction, each connected to the memory transistors of one column. A source region of each memory transistor is connected, on one side, to a source line adjacent thereto and, on the other side, to a source line through the source region of the adjacent memory transistor, through impurity regions respectively. A floating gate is formed to extend to a position under the corresponding source line. In another example, a source line is formed for each bit line formed in the column direction. The source region of each memory transistor is connected to the adjacent source lines on both sides thereof through impurity regions. The floating gate is formed to extend to positions under both adjacent source lines.

33 Claims, 12 Drawing Sheets

ERASABLE READ-ONLY SEMICONDUCTOR MEMORY DEVICE

BACKGROUND OF THE INVENTION

1. Field of the Invention

The present invention relates to semiconductor memory devices and particularly to improvements in ground resistance and operation characteristics of a nonvolatile erasable programmable read-only memory device (hereinafter referred to as EPROM).

2. Description of the Prior Art

FIG. 1 is a block diagram showing a construction of a conventional UV-EPROM (Ultraviolet EPROM).

Referring to the figure, an X address decoder 2 and a Y gate sense amplifier 3 for selecting rows and columns of memory cells are connected to a memory matrix 1 comprising a plurality of memory transistors (to be described later) arranged in rows and columns. A Y address decoder 4 which supplies column selection information is connected to the Y gate sense amplifier 3, and the X address decoder 2 and the Y address decoder 4 are respectively connected to an address buffer 5 in which address information is temporarily stored. An input/output buffer 7 which temporarily stores input/output data is connected to the Y gate sense amplifier 3. The address buffer 5 and the input/output buffer 7 are connected to a control logic 6 which controls operation of the EPROM. The control logic 6 performs control based on a chip enable signal $\overline{CE}$, an output enable signal $\overline{OE}$ and a program signal $\overline{PGM}$.

FIG. 2 is a circuit diagram showing in perspective a schematic construction of the memory cell matrix 1 shown in FIG. 1.

In the figure, a plurality of word lines WL1, WL2 to WLi are arranged in the row direction and a plurality of bit lines BL1, BL2 to BLi are arranged in the column direction so as to intersect the word lines orthogonally, thereby forming a matrix. Memory transistors Q11, Q12 to Qii each having a floating gate are arranged at respective intersections of the word lines and the bit lines. Each memory transistor has its drain connected to the corresponding bit line, its control gate connected to the corresponding word line and its source connected to the corresponding one of ground lines (S1, S2 etc.). As is shown in the figure, the sources of the memory transistors belonging to the same row are connected to each other and to the ground lines (S1, S2 etc.) arranged on both sides with connection resistances R being individually generated.

FIG. 3 is a plan view showing a portion of a definite structure of a conventional memory cell matrix and FIGS. 4 and 5 are cross sectional views taken along the lines IV—IV and V—V of FIG. 3, respectively.

Referring to FIGS. 3 to 5, the structure of the memory cell matrix will be described. An N+ impurity region 26 which will be the drain region of a memory transistor and an N+ impurity region 28 which will be the source region thereof are formed on a main surface of a semiconductor substrate 18. A floating gate 14 is formed on a channel region which is sandwiched by the N+ impurity regions 26 and 28 with a first gate oxide film 20 interposed therebetween. The first gate oxide film 20 is sandwiched by a thick isolating oxide film 19 formed on the main surface of the semiconductor substrate 18 whereby the active region thereof is ensured. A control gate 15a formed of polyside is formed on the floating gate 14 with a second gate oxide film 22 interposed therebetween, and the control gates 15a of the respective transistors are tied to each other in the row direction to form a word line 15. An interlayer insulating film 24 is formed on the entire main surface of the semiconductor substrate 1 to cover the word line 15. The interlayer insulating film 24 has contact holes 12 to provide contact with each impurity region 26. Bit lines 16 of aluminum are formed in the column direction on the entire insulating film 24 including the contact holes. The impurity regions 28 as the source regions are connected to each other to extend in the row direction and are connected to the source lines 17 extending in the column direction through the contact holes 13. Although not shown in the figure, normally one source line 17 (denoted by S1, S2 etc.) is provided for every sixteen bit lines 16.

Writing operation into the memory transistors in the EPROM thus constructed will be briefly described referring to FIGS. 1 to 6.

Address signals A0 to Ai which will be X address signals (word line selecting signals) and Y address signals (bit line selecting signals) are in parallel inputted to the address buffer 5 and those signals are applied to the Y gate sense amplifier 3 through the X address decoder 2 and the Y address decoder 4, respectively. Consequently, one word line and one bit line are selected and a high voltage Vpp (about 12.5 V for the integration scale of 1M bit) is applied thereto. On this occasion, the non-selected word lines WL and all the source lines are brought to the ground level and the non-selected bit lines BL are brought into the floating state.

Consequently, the high voltage Vpp is applied to the drain region 26 and the control gate 15a of the memory transistor to which the selected word line and bit line are connected, and, since the potential of the source region 28 is at the ground level, a relatively large current flows to the channel of the transistor. Therefore, hot electrons are injected into the first gate oxide film 20 near the drain region 26 and into the floating gate 14 due to the electric field in this oxide film 20. As a result, electrons are stored in the floating gate 14, causing increase of the threshold voltage of the transistor. In other words, the writing operation is carried out. The electrons stored in the floating gate 14 are maintained even after the application of the high voltage Vpp since the floating gate 14 and its surrounding regions are covered with the insulating film.

On the other hand, erasing operation is performed in a manner in which energy is applied to the electrons stored in the floating gate 14 by application of ultraviolet rays to cause the electrons to return to the control gate 15a or the semiconductor substrate 18.

FIG. 6 is a graph showing current/voltage characteristics of a memory transistor in an erased state and a written state.

The written or erased state is set dependent on presence or absence of the electrons in the floating gate 14 of the transistor. As is shown in the figure, the threshold voltage of the memory transistor in the written state (where "0" is stored) is different from that in the erased state (where "1" is stored). Therefore, nonvolatile information can be obtained by setting the intermediate value as a reading gate voltage $V_R$. More specifically, at the reading gate voltage $V_R$ shown in the figure, the memory transistor becomes nonconductive in the written state, so that no current flows to the bit line. On the other hand, the memory transistor becomes conductive in the erased state, so that current flows to the bit line.

Next, reading operation of the memory transistor of the EPROM will be briefly described with reference to FIGS. 1 to 5.

In the same manner as in the above described writing operation, address signals A0 to Ai which will be the X address signals and the Y address signals are in parallel inputted to the address buffer 5 and one word line and one bit line are selected. Let us consider a case in which a word line WL2 and a bit line BL2 are selected, for example. In this case, the presence or absence of information in the memory transistor Q22 is read. A voltage $V_R$ is applied to the word line WL2 while a prescribed voltage is applied to the bit line BL2. Other non-selected word lines and all the source lines are brought to the ground level and other non-selected bit lines are brought into the floating state. Consequently, a prescribed voltage is applied to the drain region of the transistor Q22, and, since the source region is at the ground potential, the drain current as shown in FIG. 7 flows between the source and drain regions if the transistor Q22 is in the erased state. This means that electric current flows in the bit line BL2. On the other hand, if the transistor Q22 is in the written state, electric current hardly flows between the source and drain regions, that is, in the bit line BL2. The current flow in the selected bit line BL2 brings about a change in voltage applied to the bit line BL2, and this change based on a reference voltage is detected and amplified by the Y gate sense amplifier 3. The detected and amplified voltage signal is obtained through the input/output buffer 7 as information and thus the reading operation is carried out.

In the conventional UV-EPROM, it is necessary to set the source potential of the memory transistor to the ground level for writing and reading as described above. Consequently, the source region 28 of each memory transistor is connected to the source line 17 through the contact hole 13 by means of an impurity region 11, as shown in FIGS. 2 and 3, so as to be set to the ground level.

However, the source potential of the memory transistor exhibits a voltage value slightly higher than the ground level due to voltage drop through resistance components of the impurity region 11.

FIG. 7 shows an equivalent circuit of one memory transistor.

In the figure, the impurity region 11 has resistance component R1 and R2. The resistance component R1 is a resistance component from the source line $SL_L$ on the left of the memory transistor to the source region (that is, the sum of a predetermined number of connection resistances in FIG. 2) and the resistance component R2 is a resistance component from the source line $SL_R$ on the right of the memory transistor to the source region (that is, the sum of a predetermined number of connection resistances in FIG. 2).

Now, let us calculate the resistance values of the resistance components R1 and R2. If the devices are highly integrated for increase of the capacity in the actual process technology, at least 80 $\Omega/\square$ needs to be considered as a sheet resistance value of the impurity region 11. Accordingly, the impurity region 11 has about 3$\square$ for each bit line BL and 0.5$\square$ to the center of the contact hole of the source line SL. For example, in a typical construction including 16 bit lines BL between the source lines $SL_L$ and $SL_R$, let us assume a case in which the memory transistor is connected to the eighth bit line BL from the left source line $SL_L$ (that is, the ninth bit line BL from the right source line $SL_R$). The resistance components R1 and R2 in this case are as follows.

$$
\begin{aligned}
R1_8 &= 80 \times 3 \times 8 + 40 \\
&= 1960 \\
&\approx 2\,K\Omega \\
\\
R2_8 &= 80 \times 3 \times 9 + 40 \\
&= 2200 \\
&\approx 2\,K\Omega \\
\\
RS_8 &= 1/(1/R1_8 + 1/R2_8)
\end{aligned}
$$

Thus, the composite resistance $RS_8$ of those resistance components is about 1 K$\Omega$.

Consequently, since a current value in writing operation is about 0.5 mA at the maximum, the source potential of the memory transistor is unavoidably increased to about 0.5 V at the maximum. Considering that a permissible error range of the high voltage Vpp is normally about ±0.3 V, the characteristics for writing operation are apparently deteriorated, which might cause erroneous operation. Particularly, in the case of the UV-EPROM of a large capacity, a width of a source line is decreased because of its large integration scale. As a result, the sheet resistance value tends to be increased, which further aggravates the above described problem. In addition, the characteristics for reading operation are also deteriorated for the same reasons.

The resistance components $R1_1$ and $R2_1$ of a memory transistor connected with the first bit line BL from the left source line $SL_L$ (that is, the 16th bit line BL from the right source line $SL_R$) are as follows.

$$
\begin{aligned}
R1_1 &= 80 \times 3 \times 1 + 40 \\
&= 280\,(\Omega) \\
R2_1 &= 80 \times 3 \times 16 + 40 \\
&= 3880\,(\Omega)
\end{aligned}
$$

Thus, the composite resistance RS thereof is about 260 $\Omega$. This value is considerably different from the value (1 K$\Omega$) of the composite resistance $RS_8$ connected to the eighth bit line BL from the source line $SL_L$. This means that the source potential of the memory transistor differs dependent on the bit line BL connected thereto. As a result, the characteristics for writing operation and those for reading operation vary due to the difference of the bit lines connected thereto and memory transistors having uniform electric characteristics cannot be formed.

SUMMARY OF THE INVENTION

An object of the present invention is to provide a semiconductor memory device having high reliability.

Another object of the present invention is to provide a semiconductor memory device in which operation characteristics of all memory transistors are uniform.

Still another object of the present invention is to provide a semiconductor memory device in which operation characteristics are not affected dependent on locations of the memory transistors.

A further object of the present invention is to provide a semiconductor memory device having excellent writing characteristics.

A still further object of the present invention is to provide a semiconductor memory device in which a potential of a floating gate in writing operation can be further increased.

A still further object of the present invention is to provide a semiconductor memory device suited for a large storage capacity.

A still further object of the present invention is to provide a semiconductor memory device in which increase of a ground potential of each memory transistor can be suppressed.

In order to accomplish the above described objects, the semiconductor memory device according to the present invention comprises a plurality of memory transistors, a plurality of voltage applying means, a plurality of first connection lines and a plurality of second connection lines. The plurality of memory transistors are arranged in a matrix. Each of the memory transistors has a first conduction electrode, a second conduction electrode and a control electrode and it stores information and changes a threshold voltage for controlling conduction between the first and second conduction electrodes based on the stored information. The plurality of voltage applying means apply a predetermined voltage to the control electrodes of the plurality of memory transistors. The plurality of first connection lines are connected to the respective first conduction electrodes of the memory transistors. The plurality of second connection lines are maintained at a predetermined potential and they are connected to the respective second conduction electrodes of the memory transistors so that the connection resistances thereof are all uniform.

In order to accomplish the above described objects, the semiconductor memory device according to another aspect of the present invention comprises a plurality of memory transistors, a plurality of word lines, a plurality of bit lines and a plurality of ground lines. The plurality of memory transistors are arranged in a plurality of rows and a plurality of columns and they store information. The plurality of word lines are provided corresponding to each row of the plurality of memory transistors and they are used to select memory transistors of the corresponding rows. The plurality of bit lines are provided corresponding to each column of the plurality memory transistors and they are used to write information into memory transistors of the corresponding columns or to read information stored in the memory transistors of the corresponding columns. The plurality of ground lines are provided and grounded corresponding to predetermined columns of the plurality of memory transistors and they are connected to the corresponding memory transistors so that the connection resistances thereof are uniform for all the memory transistors.

In order to accomplish the above described objects, the semiconductor memory device according to still another aspect of the present invention comprises a semiconductor substrate, a plurality of memory transistors and a plurality of ground lines. The plurality of memory transistors are arranged in a plurality of rows and a plurality of columns and each of the memory transistors comprises first and second conduction electrodes and first and second control electrodes. The first and second conduction electrodes are formed on a main surface of the semiconductor substrate. The first control electrode is formed on an upper portion of the main surface of the semiconductor substrate and it controls conduction between the first and second conduction electrodes based on a voltage applied thereto and a threshold voltage. The second control electrode, which is formed between the semiconductor substrate and the first control electrode, is capable of storing electric charge and changing the value of the threshold voltage dependent on presence or absence of stored charge. The plurality of ground lines are provided in the column direction adjacent to each column of the memory transistors in a one-to-one correspondence and each ground line is connected to the second conduction electrode of the memory transistor of the adjacent column through an impurity region formed on the main surface of the semiconductor substrate. The second control electrodes of the plurality of memory transistors are formed extending to positions corresponding to the ground lines adjacent to the respective memory transistors.

The semiconductor memory device constructed as described above enables connection resistances of all the memory transistors with respect to the ground lines to be uniform and accordingly operation characteristics thereof become stable and reliability is improved. Furthermore, an area occupied by each floating gate is increased and accordingly potential in writing operation can be raised, making it possible to improve writing characteristics.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 8:
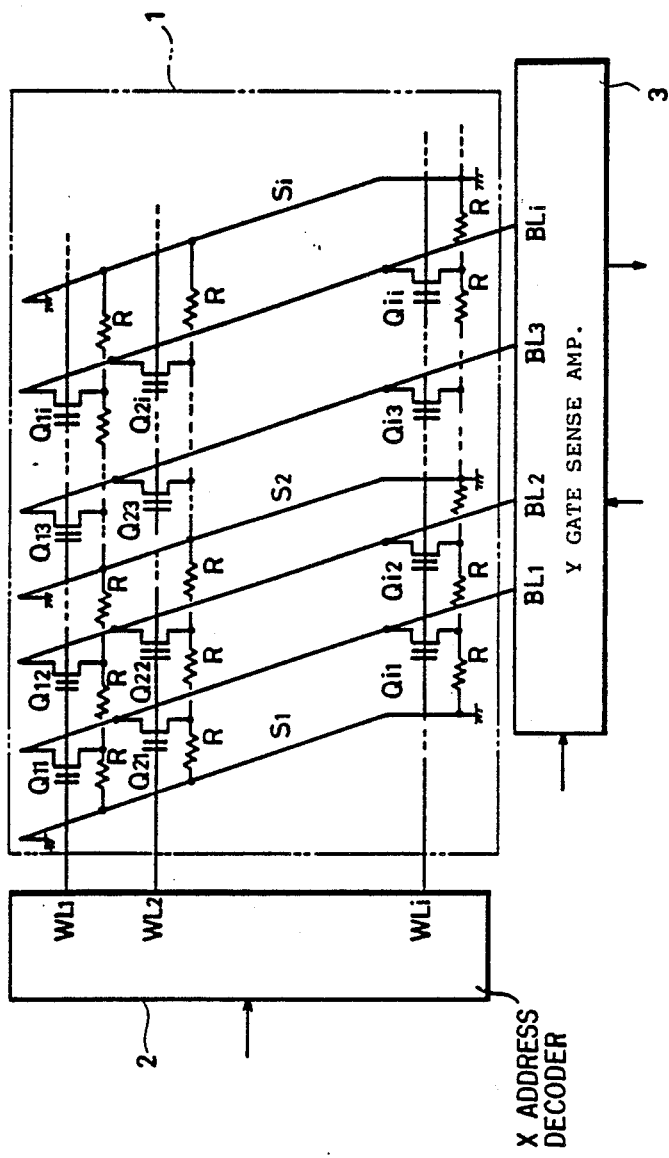
FIG. 8 is a circuit diagram showing, partly in perspective, a schematic structure of a memory cell matrix of an UV-EPROM according to an embodiment of the present invention.
Figure 9:
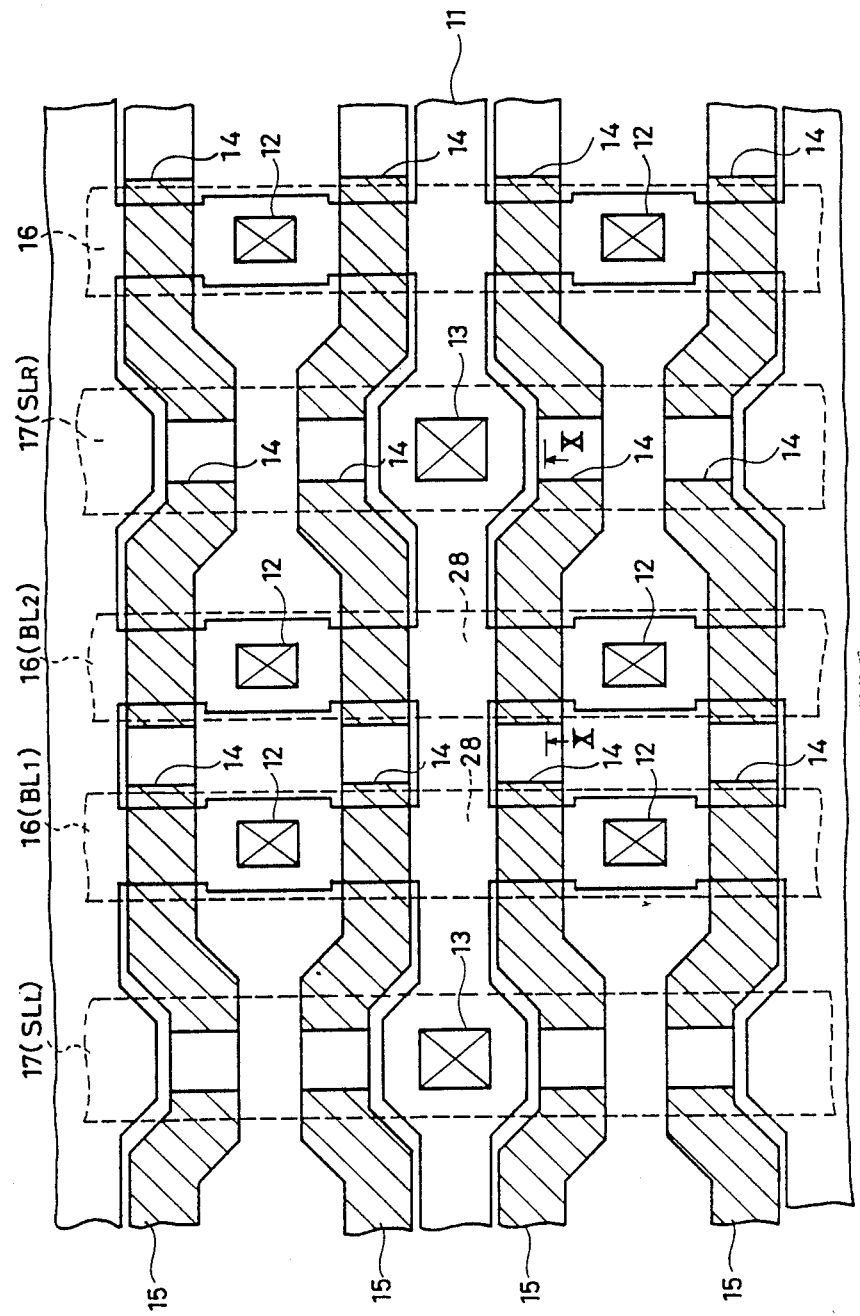
FIG. 9 is a plan view showing a portion of a concrete structure of the memory cell matrix of FIG. 8.
Figure 10:
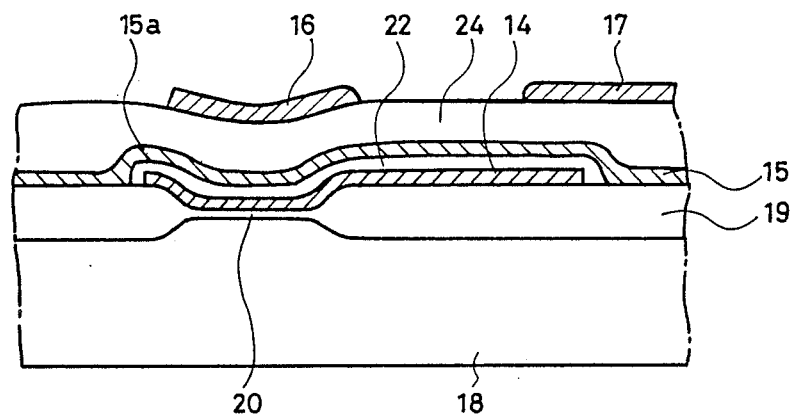
FIG. 10 is a cross sectional view taken along the lines X—X of FIG. 9, showing a state in which an end of a floating gate extends below an adjacent source line.

FIG. 8 is a circuit diagram showing in perspective a schematic structure of a memory cell matrix of an UV-EPROM according to an embodiment of the present invention. FIG. 9 is a plan view showing a portion of a concrete structure of the memory cell matrix in FIG. 8 and FIG. 10 is a cross sectional view taken along the lines X—X of FIG. 9.

Figure 1:
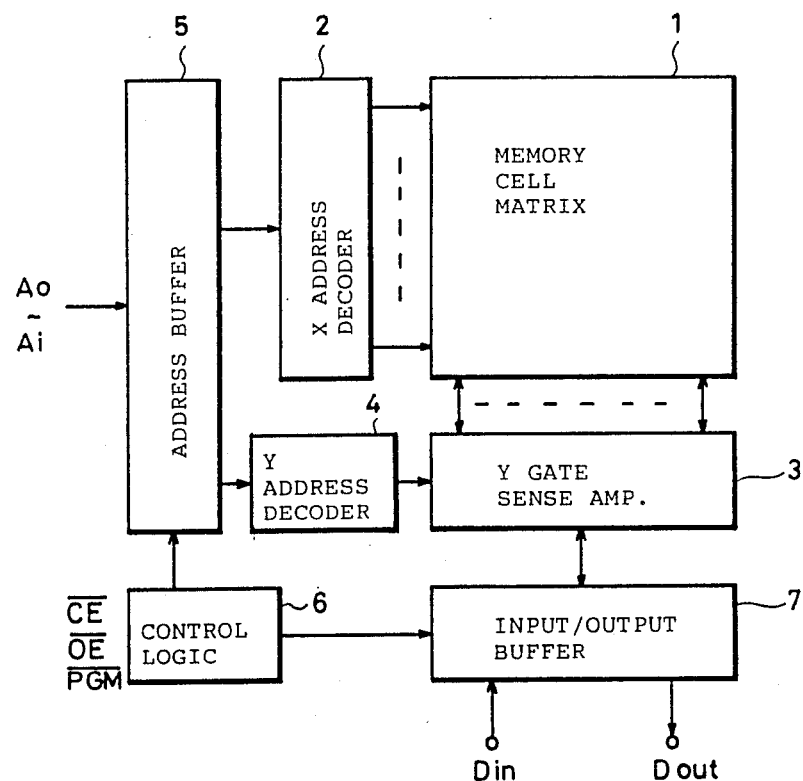
FIG. 1 is a block diagram showing a construction of a conventional UV-EPROM, illustrating an arrangement of a memory cell matrix and its surroundings.
Figure 2:
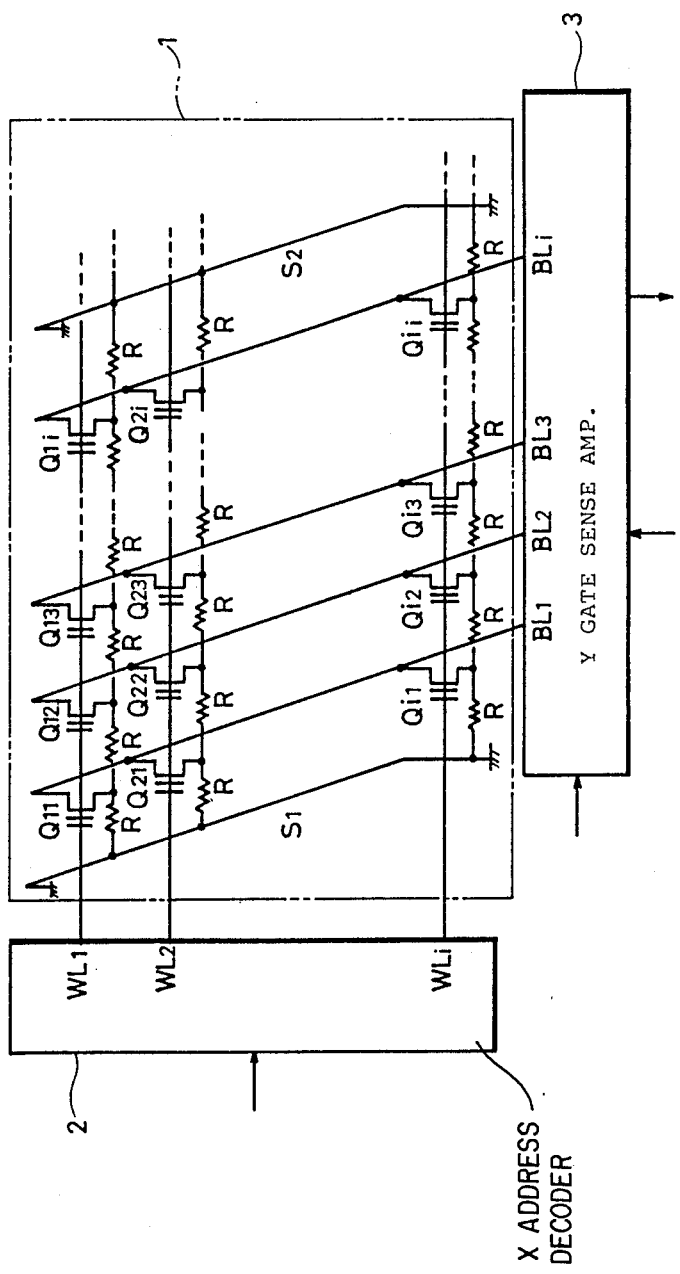
FIG. 2 a circuit diagram showing, partly in perspective, a schematic structure in the memory cell matrix shown in FIG. 1.
Figure 3:
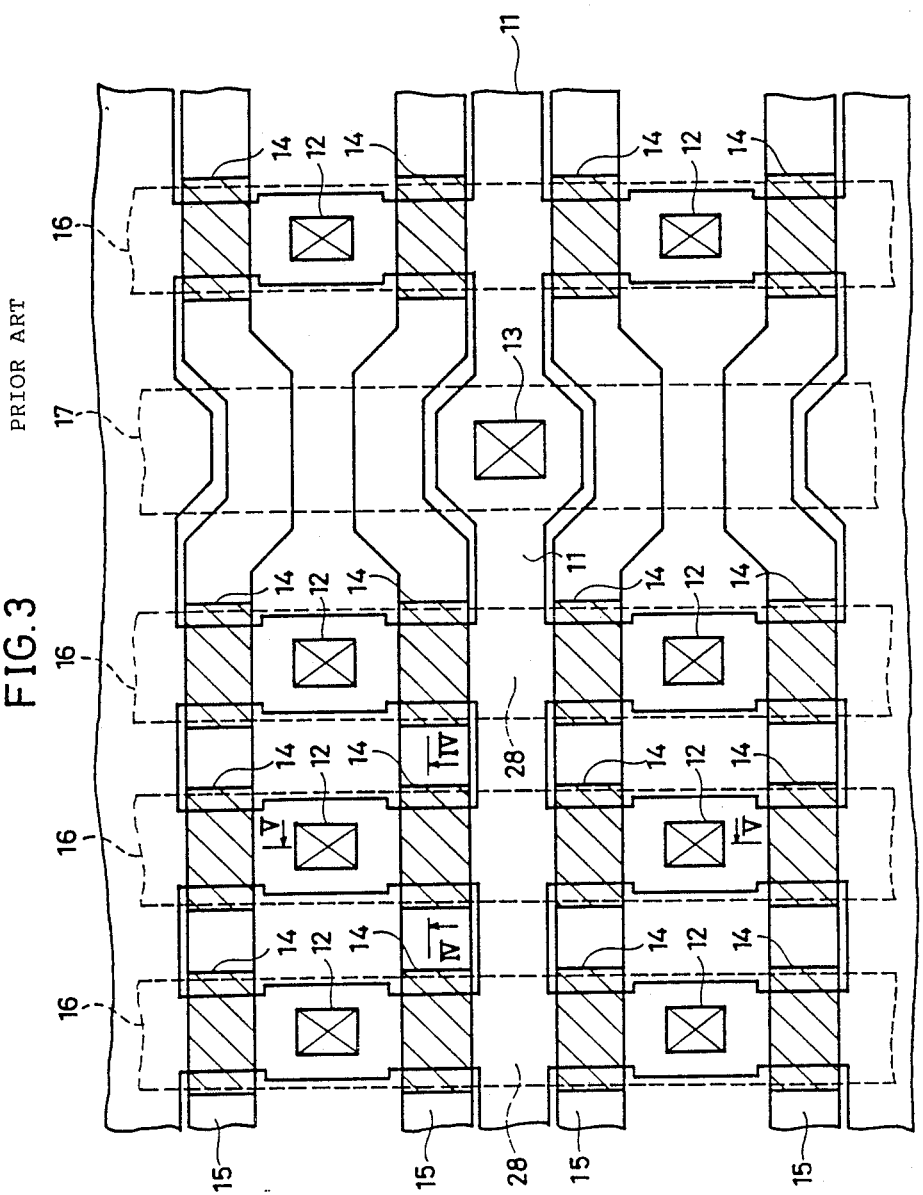
FIG. 3 is a plan view showing a portion of a concrete structure of a conventional memory cell matrix.

The structure around the memory cell matrix is the same as shown in FIGS. 1 and 2 and reading and writing operations are carried out in the same manner as described above.

Figure 4:
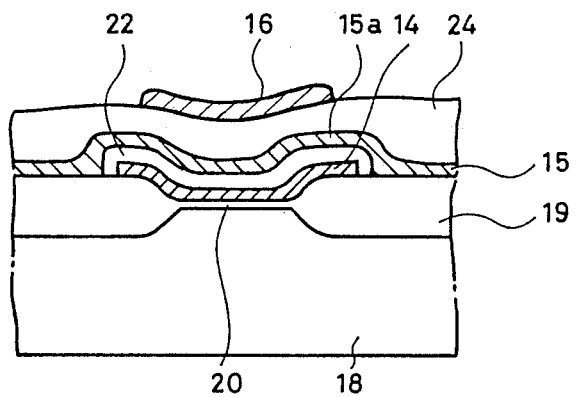
FIG. 4 is a cross sectional view taken along the lines IV—IV of FIG. 3, showing a sectional structure including floating gate.
Figure 5:
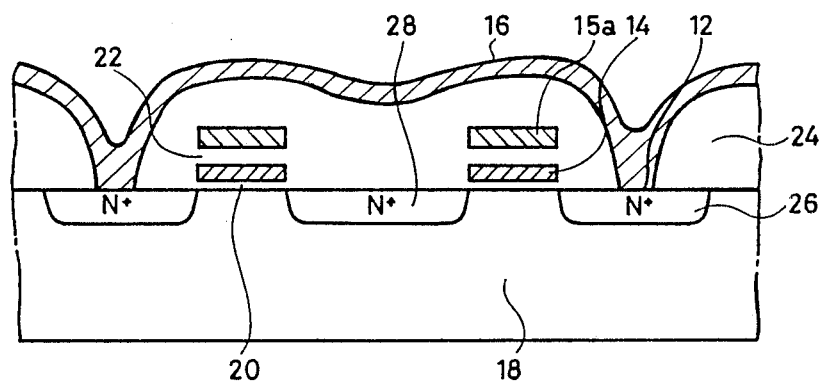
FIG. 5 is a cross sectional view taken along the lines V—V of FIG. 3, showing elements of a memory transistor.
Figure 6:
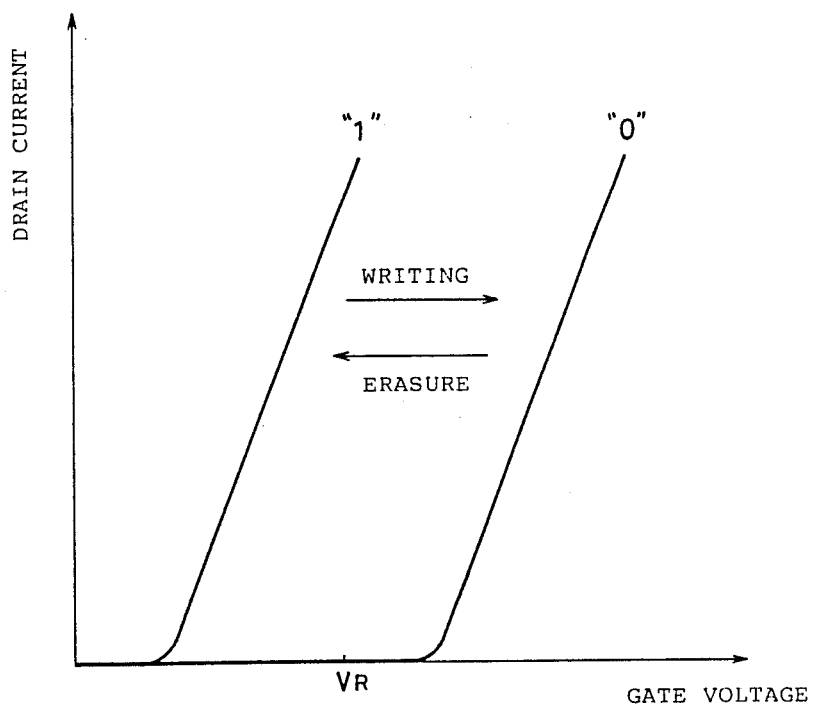
FIG. 6 is a graph showing current/voltage characteristics of a memory transistor in an erased state and a written state of an EPROM.
Figure 7:
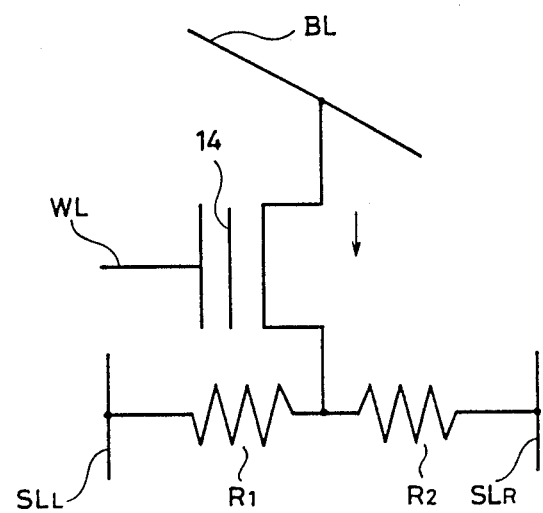
FIG. 7 is an equivalent circuit diagram of a memory transistor shown in FIG. 3.

In the following, referring to FIGS. 8 to 10, the structure and the characteristic features of the memory cell matrix will be described. Each source line 17 (denoted by S1, S2 etc.) is formed every two bit lines 16. An end of a floating gate 14 extends on an isolation oxide film 19 along a word line 15 as far as a region under a source line 17 adjacent to the bit line 16 concerned. Accordingly, the floating gate 14 is opposed to the channel region of the semiconductor substrate 18 in a region sandwiched by the isolation oxide film 19, while the entire region of the floating gate 14 is opposed to a control gate 15a of the word line 15. Thus, compared with the conventional structure shown in FIG. 4, it can be seen that the area where the control gate 15a and the floating gate 14 are opposed to each other is increased.

Figure 11:
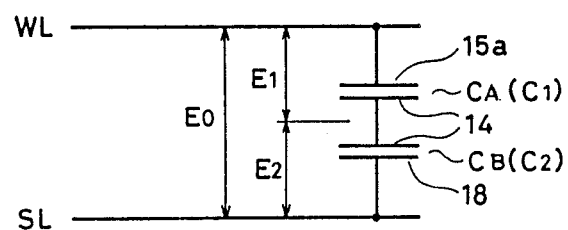
FIG. 11 is an equivalent circuit diagram of a portion including a control gate and a floating gate of a memory transistor.

In the above described construction, let us calculate a resistance value RS between a source region 28 and a source line 17 of a memory transistor with respect to an impurity region 11, referring to the equivalent circuit diagram of FIG. 11. Let us assume, in the same manner as in the previously described conventional case, that the sheet resistance value of the impurity region 11 is 80 $\Omega/\square$ (minimum), that about 3$\square$ are required for each bit line in the impurity region 11 and that 0.5$\square$ is required to the center of the contact hole of the source line SL. If the memory transistor is connected to the first bit line 16 (BL$_1$) from the left source line 17 (SL$_L$), the resistance values are as follows.

$$R1_1 = 80 \times 3 \times 1 \, (=R \times 1) + 40 = 280 \, (\Omega)$$

$$R2_1 = 80 \times 3 \times 2 \, (=R \times 2) + 40 = 520 \, (\Omega)$$

$$RS_1 = 1/(1/R1_1 + 1/R2_1) = 182 \, (\Omega)$$

Thus, the composite resistance RS$_1$ between the source region 28 and the source line 17 of the memory transistor with respect to the impurity region 11 is 182 $\Omega$.

Consequently, in writing operation, if a current for writing is assumed to be 0.5 mA at the maximum in the same manner as in the conventional example, a source potential of the memory transistor is about 0.1 V or less. This value is within the permissible error range ($\pm 0.3$ V) of the high voltage Vpp and the writing characteristics are considerably improved compared with the conventional device. As a result, even if the sheet resistance value is increased to some extent as a result of increase of the storage capacity, good writing characteristics can be ensured. The same applies to the reading characteristics. If the memory transistor is connected to the first bit line BL$_2$ from the write source line SL$_R$, the following conditions are also obtained.

$$R1_2 = 80 \times 3 \times 2 \, (=R \times 2) + 40 = 520 \, (\Omega)$$

$$R2_2 = 80 \times 3 \times 1 \, (=R \times 1) + 40 = 280 \, (\Omega)$$

$$RS_2 = 182 \, (\Omega)$$

Thus, the composite resistance RS$_2$ between the source region of the memory transistor and the source line SL with respect to the impurity region 11 is entirely the same as RS$_1$. Accordingly, there is no difference in the source potential of the memory transistor due to a difference of bit lines BL connected thereto. In other words, the electric characteristics of the memory transistor are always constant irrespective of the difference in the location where the memory transistor is formed.

FIG. 11 is an equivalent circuit diagram of a portion including a floating gate and a control gate.

Referring to FIG. 11, a capacitor CA is formed between the control gate 15a to which the word line WL is connected and the floating gate 14 through an insulating film. A capacitor CB is formed between the floating gate 14 and the semiconductor substrate 18 to which the source line SL is connected, through an insulating film.

Assuming that the voltage applied between the word line WL and the source line SL is E0, and that the voltages applied to the capacitors CA and CB are E1 and E2, respectively, the following equation is established.

$$E0 = E1 + E2$$

If capacitances of the capacitors CA and CB are represented as C1 and C2, respectively, the voltage applied between the floating gate 14 and the semiconductor substrate 18, that is, the voltage E2 applied to the capacitor CB is as follows.

$$E2 = \frac{E0C1}{C1 + C2}$$

This means that the voltage E2 is a value obtained by dividing the voltage E0 based on a ratio of the capacitances C1 and C2.

The higher the applied voltage E2, the more intensely are electrons drawn in a gate oxide film between the channel region formed in the semiconductor substrate 18 and the floating gate. Accordingly, the writing characteristics are improved. Consequently, if the high voltage applied to the control gate is constant, the applied voltage E2 is increased and therefore becomes advantageous if the capacitance C1 of the capacitor CA can be increased. The capacitance C of the capacitor is generally expressed as follows.

$$C \propto A/T$$

A: area of each of parallel plates forming the capacitor

T: distance between the parallel plates

According to this relation, if the area A is constant, the capacitance C increases as the distance T becomes small. More specifically, it would be only necessary to decrease the thickness of the insulating film between the control gates 15a and the floating gate 14. However, in such a case, although the capacitance C is increased, the dielectric strength of the insulating film is lowered, causing decrease of the reliability of EPROM.

Under the circumstances, the advantages of the present invention will become more apparent in the following description of the embodiment.

In the present embodiment, a source line SL is always provided on one side of each bit line BL; for example, as shown in the figure, the source line 17 ($SL_L$) is provided on the left side of the bit line 16 (BL1) and the source line 17 ($SL_R$) is provided on the right side of the bit line 16 (BL2). Accordingly, as shown in FIG. 9, the floating gates 14 of all the memory transistors can be formed under the corresponding word lines to extend under the respective adjacent source lines SL. As a result, an area of contact between a floating gate 14 and a control gate 15a (that is, a word line 15) through an insulating film is about twice larger than that in the conventional case. Thus, the capacitance C1 between the control gate and the floating gate can be made twice larger than that in the conventional device without applying any process such as decrease of the thickness of the insulating film between the control gate and the floating gate, which would lower the dielectric strength. This increase of the capacitance C1 contributes much to improvement of the reading characteristics of EPROM as described above.

In addition, if satisfactory writing characteristics can be obtained with a capacitance $C_{CF}$ approximately equal to that in the conventional device, the insulating film between the control gate and the floating gate may be formed to have a thickness about twice larger than that in the conventional device, making it possible to simplify the manufacturing process of the insulating film.

Figure 12:
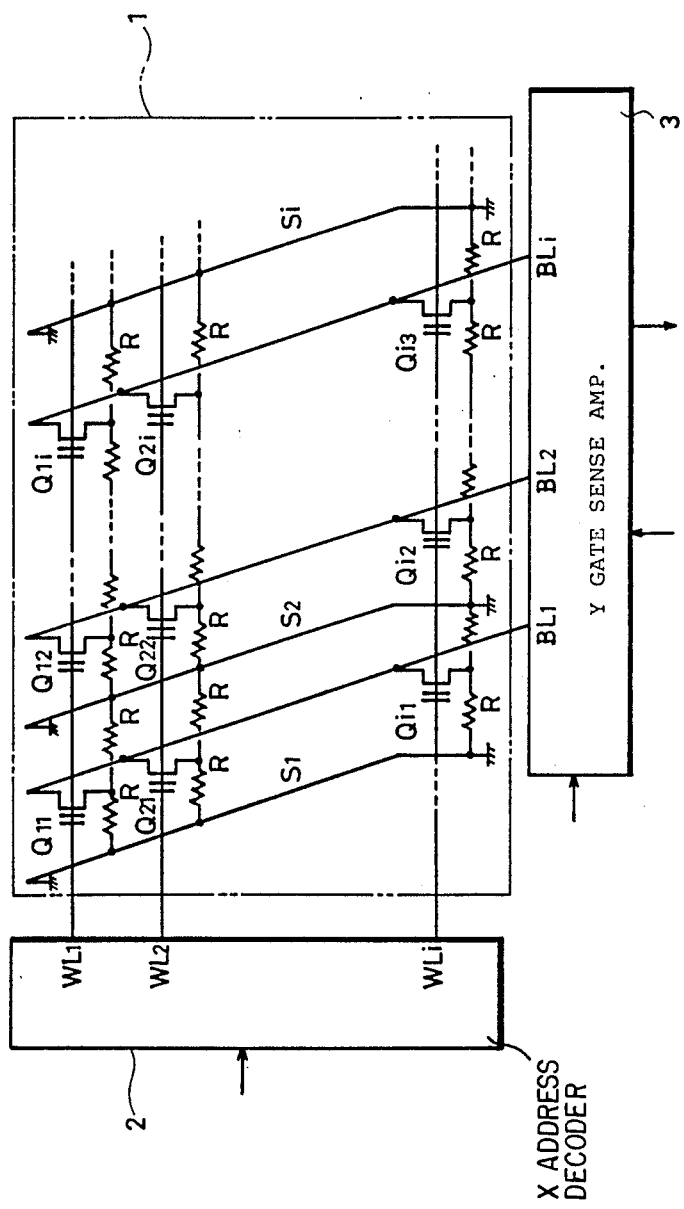
FIG. 12 is a circuit diagram showing, partly in perspective, a schematic structure of a memory cell matrix of an UV-EPROM according to another embodiment of the present invention.

FIG. 12 is a circuit diagram showing in perspective a schematic structure of a memory cell matrix of an UV-EPROM according to another embodiment of the present invention.

Figure 13:
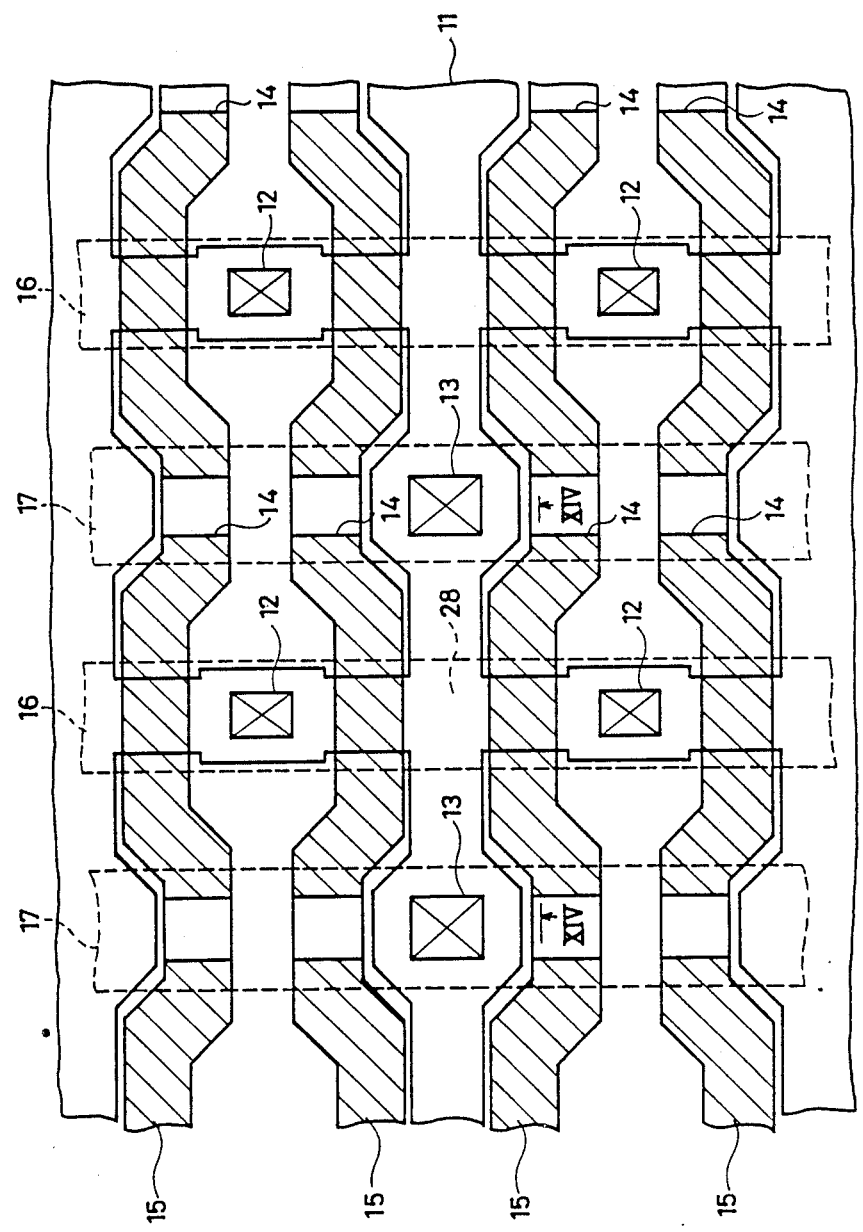
FIG. 13 is a plan view showing a portion of a concrete structure of the memory cell matrix of FIG. 12.
Figure 14:
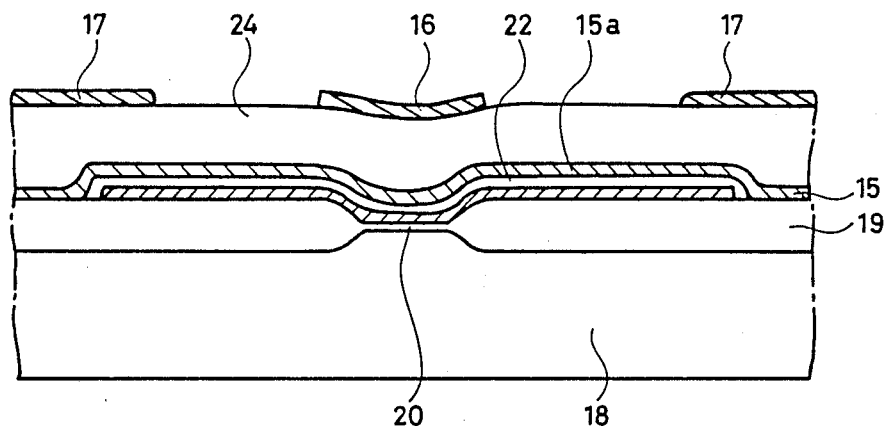
FIG. 14 is a cross sectional view taken along the lines XIV—XIV of FIG. 13, showing a state in which both ends of a floating gate extend below the respective adjacent source lines.

FIG. 13 is a plan view showing a portion of a concrete structure of the memory cell matrix shown in FIG. 12. FIG. 14 is a cross sectional view taken along the line XIV—XIV of FIG. 13.

Referring to FIGS. 12 to 14, source lines 17 and bit lines 16 are formed alternately. In addition, as shown in FIG. 14, both ends of the floating gate 14 are formed under the word line 15 to extend under the respective adjacent source lines 17. Other structure is the same as in the conventional device and the same functions are performed.

In the above described structure of the embodiment, a composite capacitance RS of the resistance of the source region of the memory transistor and that of the source lines SL, evaluated with respect to the diffusion layer 11 is 140 Ω and the capacitance C1 between the control gate and the floating gate can be made about three times larger than that in the conventional device. Accordingly, improvements are made not only in the uniformity of the memory transistors but also the writing characteristics and the reading characteristics.

Although the UV-EPROMs are used in the above described embodiments, the present invention is also applicable to other semiconductor memory devices including floating gate type memory devices, such as an $E^2$PROM (electrically erasable and programmable ROM), a simultaneous erasure type $E^2$PROM and an NVRAM (nonvolatile RAM). In addition, the present invention is also applicable to a semiconductor memory device including a volatile memory device such as a RAM if memory transistors are formed in a matrix and if the source potentials of the memory transistors are made constant at low level.

As described above in connection with the respective embodiments, the present invention makes it possible to provide a semiconductor memory device having improved characteristics for writing and reading and high reliability, suited for a large storage capacity since connections of the source regions and the ground lines for all the memory transistors exhibit an identical and low resistance value. Further, since an area occupied by each floating gate can be increased, the potential of each floating gate in writing operation is increased, which further improves the writing characteristics.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory transistors arranged in a matrix, each said memory transistor having a first conduction electrode, a second conduction electrode and a first control electrode to store information and change a threshold voltage for controlling conduction between said first and second conduction electrodes based on stored information,
   a plurality of first voltage applying means for applying a first voltage to the respective control electrodes of said plurality of memory transistors,
   first connection lines connected to the first conduction electrodes of said plurality of memory transistors, and
   second connection lines continuously maintained at a first predetermined constant voltage and interconnection means for interconnecting continuously each one of said second conduction electrodes of said plurality of memory transistors and said second connection lines, said interconnection means including means for establishing substantially the same value of connection resistance between each one of said second conduction electrodes and said second connection lines.

2. A semiconductor memory device in accordance with claim 1, wherein
   said memory transistors are arranged in a plurality of rows and a plurality of columns; said plurality of first voltage applying means are provided corresponding to each row of said plurality of memory transistors; and said first connection lines are provided corresponding to each column of said plurality of memory transistors, a second predetermined voltage being applied to said first connection lines.

3. A semiconductor memory device in accordance with claim 2, wherein
   each of said plurality of second connection lines is provided for predetermined columns of said plurality of memory transistors.

4. A semiconductor memory device in accordance with claim 1, wherein
   each said memory transistor includes a second control electrode capable of storing electric charge and said second control electrode changes said threshold voltage dependent on whether or not the electric charge is stored.

5. A semiconductor memory device in accordance with claim 4, wherein
said second control electrode includes a floating gate.

6. A semiconductor memory device in accordance with claim 5, wherein
said semiconductor memory device includes an EPROM.

7. A semiconductor memory device in accordance with claim 4, wherein
said plurality of memory transistors are arranged in a plurality of columns and rows in a substrate,
each of said second connection lines is formed for one column of said memory transistors, to extend parallel to and along a side thereof on the substrate,
and the second control electrode of each said memory transistor is formed to extend to positions between a main surface of said semiconductor substrate and the respective second connection line on both sides of said memory transistor.

8. A semiconductor memory device in accordance with claim 4, wherein
said plurality of memory transistors are arranged in a plurality of columns and rows in a substrate,
each of said second connection lines is formed for two columns of said memory transistors, to extend parallel to and along a side of a respective column on the substrate,
and the second control electrode of each said memory transistor is formed to extend to positions between a main surface of said semiconductor substrate and the respective second connection line on one side of said memory transistor.

9. A semiconductor memory device, comprising:
a plurality of memory transistors arranged in a matrix of rows and columns, each said memory transistor having a drain electrode, a source electrode and a first control electrode for controlling conduction between said drain and source electrodes based on a threshold voltage representing stored information;
a plurality of bit lines for applying a bit line voltage to the drain electrodes of said plurality of memory transistors;
ground lines continuously maintained at a predetermined constant voltage; and
interconnection means for interconnecting each one of said source electrodes of said plurality of memory transistors and said ground lines, said interconnection means including means for establishing substantially the same value of connection resistance between each one of said source electrodes and said ground lines.

10. A semiconductor memory device in accordance with claim 9, wherein
each said ground line is provided for one column of said memory transistors.

11. A semiconductor memory device in accordance with claim 9, wherein
each said ground line is provided for two columns of said memory transistors.

12. A semiconductor memory device in accordance with claim 9, wherein
each said memory transistor includes a second control electrode capable of storing electric charge and said second control electrode changes said threshold voltage dependent on whether or not the electric charge is stored.

13. A semiconductor memory device in accordance with claim 12, further comprising:
first selection means for selecting an arbitrary one of a plurality of word lines corresponding to said rows,
first voltage applying means for applying a first predetermined voltage to the word line selected by said first selection means,
second selection means for selecting an arbitrary one of said plurality of bit lines,
second voltage applying means for applying said bit line voltage to the bit line selected by said second selection means, and
detection means provided for each of said plurality of bit lines, for detecting presence or absence of electric current in the bit line selected by said second selection means.

14. A semiconductor memory device in accordance with claim 12, further comprising
a semiconductor substrate having a main surface, wherein
said drain and source electrodes of said memory transistor are formed on a main surface of said semiconductor substrate, said first control electrode is formed in an upper portion of a channel region of said semiconductor substrate between said drain and source electrodes, and said second control electrode is formed between said semiconductor substrate and said first control electrode,
said ground lines are provided in the column direction adjacent to the respective columns of said plurality of memory cells and each said ground line is connected to the second conduction electrode of the memory cell of the column adjacent thereto through an impurity region formed on the main surface of said semiconductor substrate, and
the second control electrode of each said memory transistor is formed to extend to a position corresponding to the ground line adjacent to said memory transistor.

15. A semiconductor memory device in accordance with claim 14, wherein
the main surface of said semiconductor substrate together with said first and second conduction electrodes is covered with an interlayer insulating film.

16. A semiconductor memory device in accordance with claim 15, wherein
each said ground line is formed on said interlayer insulating film and is connected to said impurity region through a contact hole provided in said interlayer insulating film.

17. A semiconductor memory device in accordance with claim 16, wherein
each said ground line is formed for one column of said memory transistors and the second control electrode of each said memory transistor is formed to extend to positions between the main surface of said semiconductor substrate and the respective ground lines on both sides of said memory transistor.

18. A semiconductor memory device in accordance with claim 16, wherein
each said ground line is formed for two columns of said memory transistors and the second control electrode of each said memory transistor is formed to extend to a position between the main surface of said semiconductor substrate and the ground line on one side of said memory transistor.

19. A semiconductor memory device in accordance with claim 14, wherein
a transistor region including the drain and source electrodes of the memory transistor arranged in the corresponding column as well as the channel region of said semiconductor substrate sandwiched between said first and second conduction electrodes is isolated from a transistor region of the memory transistor arranged in another column adjacent thereto by means of an isolation oxide film formed on the main surface of said semiconductor substrate.

20. A semiconductor memory device in accordance with claim 19, wherein
an area of said second control electrode opposed to said channel region is smaller than that of said first control electrode opposed to said second control electrode, and first and second gate oxide films are formed between said channel region and said second control electrode and between said second control electrode and said first control electrode, respectively.

21. A semiconductor memory device in accordance with claim 19, wherein
said second control electrode includes a floating gate.

22. A semiconductor memory device in accordance with claim 21, wherein
said semiconductor memory device includes an EPROM.

23. A semiconductor memory device comprising:
a semiconductor substrate having a main surface;
a plurality of memory transistors arranged in a matrix of rows and columns each memory transistor including:
first and second conduction electrodes formed on the main surface of said semiconductor substrate,
a first control electrode formed above the main surface of said semiconductor substrate,
a first control electrode formed above the main surface of said semiconductor substrate, for controlling conduction between said first and second conduction electrodes based on a voltage applied thereto and a threshold voltage,
a second control electrode formed between said semiconductor substrate and said first control electrode and being capable of storing electric charge and changing said threshold voltage dependent on presence or absence of the stored electric charge therein, and
ground lines continuously maintained at a first predetermined constant voltage and provided in the column direction adjacent the respective columns of said plurality of memory transistors, and
interconnection means for interconnecting each one of said second conduction electrodes of said plurality of memory transistors and said ground lines, said interconnection means including means for establishing substantially the same value of connection resistance between each one of said second conduction electrodes and said ground lines,
the second control electrode of each said memory transistor being formed to extend to a position corresponding to the ground line adjacent to said memory transistor.

24. A semiconductor memory device in accordance with claim 23, wherein
the main surface of said semiconductor substrate together with said first and second conduction electrodes is covered with an interlayer insulating film.

25. A semiconductor memory device in accordance with claim 24, wherein
each said ground line is formed on said interlayer insulating film and is connected to said impurity region through a contact hole provided in said interlayer insulating film.

26. A semiconductor memory device in accordance with claim 25, wherein
each said ground line is formed for one column of said memory transistors and the second control electrode of each said memory transistor is formed to extend to positions between the main surface of said semiconductor substrate and the respective ground lines on both sides of said memory transistor.

27. A semiconductor memory device in accordance with claim 25, wherein
each said ground line is formed for two columns of said memory transistors and the second control electrode of each said memory transistor is formed to extend to a position between the ground line on one side of said memory transistor and the main surface of said semiconductor substrate.

28. A semiconductor memory device in accordance with claim 23, wherein
a transistor region including the first and second conduction electrodes of the memory transistor arranged in the corresponding column as well as the channel region of said semiconductor substrate sandwiched between said first and second conduction electrodes is isolated from a transistor region of the memory transistor arranged in another column adjacent thereto by means of an isolation oxide film formed on the main surface of said semiconductor substrate.

29. A semiconductor memory device in accordance with claim 28, wherein
an area of said second control electrode opposed to said channel region is smaller than that of said first control electrode opposed to said second control electrode, and first and second gate oxide films are formed between said channel region and said second control electrode and between said second control electrode and said first control electrode, respectively.

30. A semiconductor memory device in accordance with claim 29, wherein
the first conduction electrode, the channel region and the second conduction electrode of each said memory transistor are formed in the column direction and said first control electrode is connected with the first control electrode of the memory transistor of the same row and of the column adjacent thereto.

31. A semiconductor memory device in accordance with claim 30, wherein
said second control electrode includes a floating gate.

32. A semiconductor memory device in accordance with claim 31, wherein
said semiconductor memory device includes an EPROM.

33. A method of uniformizing the threshold voltages of a non-volatile semiconductor memory device comprising a plurality of memory transistors arranged in a matrix, each said memory transistor having a drain electrode, a source electrode and a control electrode to store information and change a threshold voltage for controlling conduction between said drain and source electrodes based on stored information, and a plurality of bit lines for applying a first voltage to the drain electrodes of said plurality of memory transistors, said method comprising the steps of:

locating a plurality of ground lines maintained at a predetermined constant voltage among said plurality of bit lines; and interconnecting continuously each of said source electrodes of said plurality of memory transistors and said ground lines so that substantially the same value of connection resistance is established between each one of said source electrodes and said ground lines.

* * * * *